United States Patent
Glass et al.

(10) Patent No.: US 9,842,928 B2
(45) Date of Patent: Dec. 12, 2017

(54) TENSILE SOURCE DRAIN III-V TRANSISTORS FOR MOBILITY IMPROVED N-MOS

(71) Applicant: Intel Corporation, Santa Clara, CA (US)

(72) Inventors: Glenn A. Glass, Beaverton, OR (US); Anand S. Murthy, Portland, OR (US); Chandra S. Mohapatra, Beaverton, OR (US)

(73) Assignee: Intel Corporation, Santa Clara, CA (US)

( * ) Notice: Subject to any disclaimer, the term of this patent is extended or adjusted under 35 U.S.C. 154(b) by 0 days.

(21) Appl. No.: 15/036,571

(22) PCT Filed: Dec. 23, 2013

(86) PCT No.: PCT/US2013/077627
§ 371 (c)(1),
(2) Date: May 13, 2016

(87) PCT Pub. No.: WO2015/099692
PCT Pub. Date: Jul. 2, 2015

(65) Prior Publication Data
US 2016/0293760 A1    Oct. 6, 2016

(51) Int. Cl.
*H01L 29/04* (2006.01)
*H01L 29/78* (2006.01)
(Continued)

(52) U.S. Cl.
CPC ...... *H01L 29/7848* (2013.01); *H01L 29/0649* (2013.01); *H01L 29/1054* (2013.01);
(Continued)

(58) Field of Classification Search
CPC ................ H01L 29/66492; H01L 29/7784
See application file for complete search history.

(56) References Cited

U.S. PATENT DOCUMENTS 5,963,817 A * 10/1999 Chu .................. H01L 21/76264
257/E21.564
8,455,313 B1    6/2013 Basker et al.
(Continued)

FOREIGN PATENT DOCUMENTS

TW    201027751 A    7/2010
TW    201227831 A    7/2012
(Continued)

OTHER PUBLICATIONS

First Office Action and Taiwan IPO Search Report—Taiwan Patent Application No. 103140470; dated Jun. 15, 2016, 15 pages.
(Continued)

*Primary Examiner* — Thao P Le
(74) *Attorney, Agent, or Firm* — Schwabe Williamson & Wyatt P.C.

(57) ABSTRACT

An n-MOS transistor device and method for forming such a device are disclosed. The n-MOS transistor device comprises a semiconductor substrate with one or more replacement active regions formed above the substrate. The replacement active regions comprise a first III-V semiconductor material. A gate structure is formed above the replacement active regions. Source/Drain (S/D) recesses are formed in the replacement active region adjacent to the gate structure. Replacement S/D regions are formed in the S/D recesses and comprise a second III-V semiconductor material having a lattice constant that is smaller than the lattice constant of the first III-V semiconductor material. The smaller lattice constant of the second III-V material induces a uniaxial-strain on the channel formed from the first III-V material. The uniaxial strain in the channel improves carrier mobility in the n-MOS device.

11 Claims, 10 Drawing Sheets

(51) Int. Cl.
*H01L 29/66* (2006.01)
*H01L 29/10* (2006.01)
*H01L 29/06* (2006.01)

(52) U.S. Cl.
CPC .. *H01L 29/66522* (2013.01); *H01L 29/66795* (2013.01); *H01L 29/66818* (2013.01); *H01L 29/785* (2013.01)

(56) References Cited

U.S. PATENT DOCUMENTS

| | | |
|---|---|---|
| 2008/0283906 A1 | 11/2008 | Bohr |
| 2009/0256173 A1* | 10/2009 | Chen ............... H01L 21/823807 257/190 |
| 2010/0109089 A1 | 5/2010 | Obradovic et al. |
| 2010/0252862 A1* | 10/2010 | Ko ..................... H01L 29/1054 257/192 |
| 2010/0301391 A1 | 12/2010 | Lochtefeld |
| 2011/0215375 A1 | 9/2011 | Cook, Jr. et al. |
| 2012/0074464 A1 | 3/2012 | Cea et al. |
| 2013/0099282 A1 | 4/2013 | Chen et al. |
| 2013/0099283 A1* | 4/2013 | Lin ...................... H01L 29/267 257/190 |
| 2013/0187206 A1 | 7/2013 | Mor et al. |
| 2013/0292698 A1* | 11/2013 | Then ................... H01L 29/4236 257/76 |
| 2014/0045306 A1* | 2/2014 | Bour ................. H01L 21/02389 438/192 |
| 2015/0279982 A1* | 10/2015 | Yamamoto ........ H01L 29/42316 257/76 |

FOREIGN PATENT DOCUMENTS

| | | |
|---|---|---|
| WO | WO 2008/036681 A1 | 3/2008 |
| WO | WO 2013/095376 A1 | 6/2013 |

OTHER PUBLICATIONS

International Preliminary Report on Patentability—PCT Application No. PCT/US2013/077267; dated Jul. 7, 2016, 9 pages.
Notification of Transmittal of the International Search Report and the Written Opinion for PCT/US2013/077627, dated Sep. 4, 2014, International Filing Date Dec. 23, 2013, 12 pages.
European Search Report—European Patent Application No. 13900120.0; dated Jun. 22, 2017, 10 pages.

* cited by examiner

US 9,842,928 B2

TENSILE SOURCE DRAIN III-V TRANSISTORS FOR MOBILITY IMPROVED N-MOS

This patent application is a U.S. National Phase Application under 35 U.S.C. §371 of International Application No. PCT/US2013/077627 filed Dec. 23, 2013, entitled "TENSILE SOURCE DRAIN III-V TRANSISTORS FOR MOBILITY IMPROVED N-MOS".

FIELD OF THE INVENTION

The present invention relates generally to the manufacture of semiconductor devices. In particular, embodiments of the present invention relate to semiconductor devices with III-V replacement channel regions and III-V replacement source/drain (S/D) regions.

BACKGROUND AND RELATED ARTS

A key design parameter for a transistor device is the current delivered at a given designed voltage. This parameter is commonly referred to as the drive current or saturation current ($I_{Dsat}$). One factor that has an effect on the drive current is the carrier mobility of the channel region. Increases in the carrier mobility in the channel region result in increases in the drive current. The carriers in n-MOS and p-MOS transistors are electrons and holes respectively. The electron mobility of the channel region in n-MOS devices may be increased by exposing the region to a uniaxial tensile strain. Alternatively, the hole mobility of the channel region in p-MOS devices may be increased by applying a uniaxial compressive strain on the channel region.

DETAILED DESCRIPTION

In the following detailed description, a MOS transistor and its method of formation are disclosed. Reference is made to the accompanying drawings, which form a part hereof, and within which are shown by way of illustration specific embodiments by which the present invention may be practiced. It is to be understood that other embodiments may be utilized and structural changes may be made without departing from the scope and spirit of the present invention. Embodiments of the invention are directed to III-V n-MOS devices with improved electron mobility in the channel. The electron mobility is increased by providing a tensile strain on the channel. The tensile strain is produced by forming a mismatch between the lattice constants of a replacement active region and a replacement S/D regions.

An embodiment of the invention utilizes a monocrystalline silicon substrate with sacrificial fins. A shallow trench isolation (STI) layer is disposed between the sacrificial fins. Thereafter, the sacrificial fins are etched away. Replacement active regions made from a III-V semiconductor material are then epitaxially grown in the spaces previously occupied by the sacrificial fins. The STI layer may then be etched back such that the top portion of the replacement active regions exudes from the STI plane. Thereafter, a gate structure may be formed over the replacement active regions and the STI layer. Recesses are then formed into the replacement active regions on both sides of the gate. A second III-V semiconductor material is then epitaxially grown in the recesses over the surface of the replacement active regions to form the replacement S/D regions. The second III-V semiconductor material is chosen such that there is a lattice mismatch between the replacement S/D region and the replacement active region. The lattice mismatch between the two materials generates a tensile strain in the channel formed in the replacement active region, thereby increasing the electron mobility.

Figure 1A:
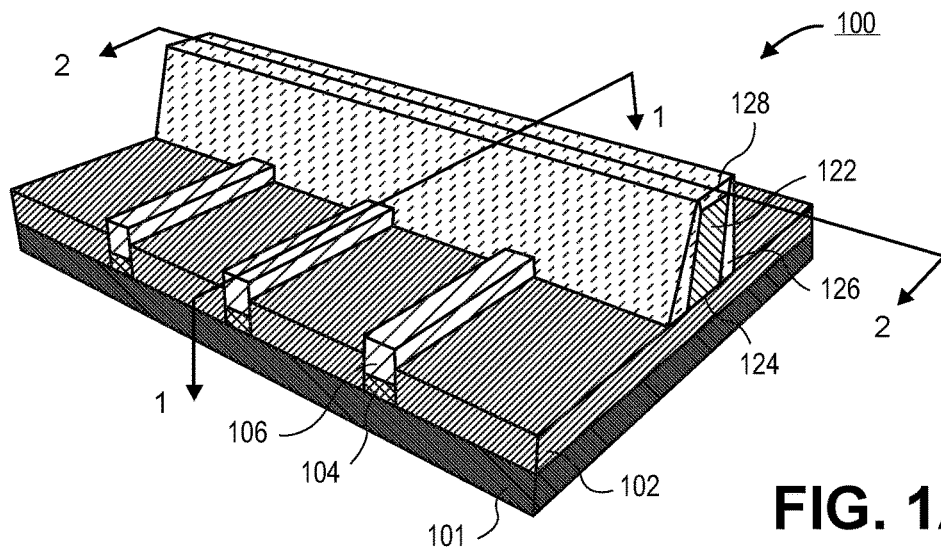
FIG. 1A illustrates a perspective view of n-MOS transistors formed on a semiconductor substrate in accordance with an embodiment of the invention.

FIG. 1A illustrates a perspective view of an n-MOS transistor device 100 formed on a semiconductor substrate 101 according to an embodiment of the invention. Portions of the transistor device 100, such as a gate dielectric, interlayer dielectric and S/D contacts are not shown for purposes of clarity. Semiconductor substrate 101 may be composed of a material suitable for semiconductor device fabrication. In one embodiment the semiconductor substrate 101 is a monocrystalline silicon substrate. In one embodiment, the structure is formed using a bulk semiconductor substrate. Substrate 101 may also be, but is not limited to, germanium, silicon-germanium, or a III-V compound semiconductor material. In another embodiment, the structure is formed using a silicon-on-insulator (SOI) substrate.

A shallow trench isolation (STI) layer 102 is formed on the top surface of the semiconductor substrate 101. STI layer 102 may be a silicon dioxide or the like. The trenches in STI layer 102 are filled with replacement active regions 104 and replacement S/D regions 106. Replacement active regions 104 are a III-V semiconductor material epitaxially grown on the semiconductor substrate 101. According to an embodiment of the invention, the replacement active regions 104 are a different semiconductor material than the semiconductor substrate 101. According to an embodiment, the replacement active regions 104 may be either a single composition layer or a graded bilayer. An example of a suitable III-V material for a single composition may include an InGaAs composition or an InSb composition. According to an additional embodiment, the replacement active regions 104 may be a multi-layer stack. A multi-layer stack is beneficial for providing a high quality interface between different semiconductor materials, such as a silicon semiconductor substrate 101 and a III-V semiconductor replacement active region 104, while maintaining a high electron mobility in the channel 105. Suitable III-V materials for a low defect, multi-layer stacks may include stacked layers such as, (GaAs, InP, InGaAs), (InP, InGaAs), (InAlAs, InGaAs), (InP, InGaSb, InSb), or (AlSb, InGaSb, InSb). After the replacement active regions 104 have been formed, recesses are formed in the replacement active region on both sides of the electrode by etching away portions of the replacement active region. The replacement S/D regions 106 are then epitaxially grown in the recessed replacement active regions 104. The STI layer 102 confines the growth of the replacement S/D regions 106 to the vertical direction while they are in the recessed portion of the replacement active region 104. According to an embodiment, replacement S/D regions 106 may extend above the STI layer 102. Though not shown in FIG. 1A, once the replacement S/D region has extended above the top surface of the STI layer 102, the replacement S/D regions 106 may grow laterally if they are not confined by another material, such as an interlayer dielectric.

The replacement S/D regions 106 are an epitaxially grown monocrystalline III-V semiconductor material. In an embodiment, the III-V semiconductor material chosen for the replacement S/D regions 106 has a smaller lattice constant than the lattice constant of the replacement active region 104. An additional embodiment includes a III-V semiconductor material for the replacement S/D regions 106 that has a smaller lattice constant relative to the replacement active region 104, and also has the same or similar lattice type as the replacement active region 104. According to an additional embodiment, the III-V semiconductor material chosen for the replacement S/D regions 106 has a smaller lattice constant relative to the replacement active regions 104, and has a different elemental composition than the replacement active region 104.

According to an embodiment, the smaller lattice constant is obtained by increasing the atomic percentage of a smaller element. For example, in an embodiment the replacement active region 104 may be formed with a first $In_xGa_{1-x}As$ semiconductor material. The replacement S/D regions 106 may then be formed with a second $In_xGa_{1-x}As$ semiconductor material that has a lower atomic percentage of the larger element, In, and a higher atomic percentage of a smaller element, such as gallium (Ga) relative to the replacement active region. By way of example, the replacement active regions 104 may be formed with an $In_{0.53}Ga_{0.47}As$ semiconductor material and the replacement S/D regions 106 may be formed with an $In_{0.25}Ga_{0.75}As$ semiconductor material. The resulting mismatch between the lattice constants of the two regions in such an embodiment is 2%. The substitution of Ga for In results in the replacement S/D regions 106 having a lattice with the same crystal structure as the lattice type of the replacement active regions 104, but which also have a smaller in-plane lattice constant than the replacement active regions 104. The smaller spaced lattice of the replacement S/D regions 106 generates a uniaxial tensile strain in the channel region 105. Additional embodiments may generate uniaxial tensile strain by utilizing replacement S/D regions 106 that have a smaller lattice constant than the replacement active regions 104 due to the use different III-V elements. By way of example, and not by way of limitation, the replacement active regions 104 may be InAs, and the replacement S/D regions 106 may be GaP.

The amount of uniaxial tensile strain in the channel 105 increases as the lattice constant mismatch between the replacement S/D regions 106 and the replacement active region 104 is increased. However, once the mismatch becomes too large, defects form in the replacement S/D regions 106 and the strain is reduced in the channel 105. The decreased strain in the channel 105 results in decreased electron mobility. As such, the lattice mismatch between the replacement S/D regions 106 and the replacement active region 104 should be sufficient to produce enough strain in the channel 105 to enhance mobility. However, the mismatch should not be extreme enough to form excessive defects in the replacement S/D regions 106 that will prevent strain from forming in the replacement active regions 104. Accordingly, embodiments of the invention may utilize a lattice constant mismatch that is between approximately 0.5% and approximately 6%. An additional embodiment may utilize a lattice constant mismatch that is approximately 2%. As used herein, approximately means that the measured value is within 10% of the listed value (e.g., "approximately 2%" is equivalent to the range of 1.8%-2.2%). The ability to control the lattice mismatch between the replacement active region 104 and the replacement S/D regions 106 improves an otherwise equivalent device by employing a targeted strain field to tune the mobility of the electrical carriers in a favorable way.

Referring back to FIG. 1A, a gate structure 120 is formed above the STI layer 102 and the replacement active region 104. The gate structure 120 may be any gate structure that is well known in the art. Embodiments of the invention include a gate structure 120 that has a gate cap 128 formed on the top surface of the gate electrode 122. The gate cap 128 may be a metal oxide material or other insulative material (e.g., silicon dioxide or silicon nitride). According to an embodiment, the gate structure 120 may comprise a gate dielectric 124 disposed between the gate electrode 122 and the replacement active region 124. The gate dielectric 124 may be an oxide material, such as silicon dioxide or silicon oxynitride, or any high-k dielectric material, such as, $HfO_2$ or ZrO. The gate electrode 122 may be a suitably doped polysilicon electrode or a metal electrode. The gate structure 120 may also include spacers 126 along the sidewalls. The gate spacers 126 are a typical dielectric spacer material, such as silicon dioxide, silicon nitride, or a silicon carbide.

Figure 1B:
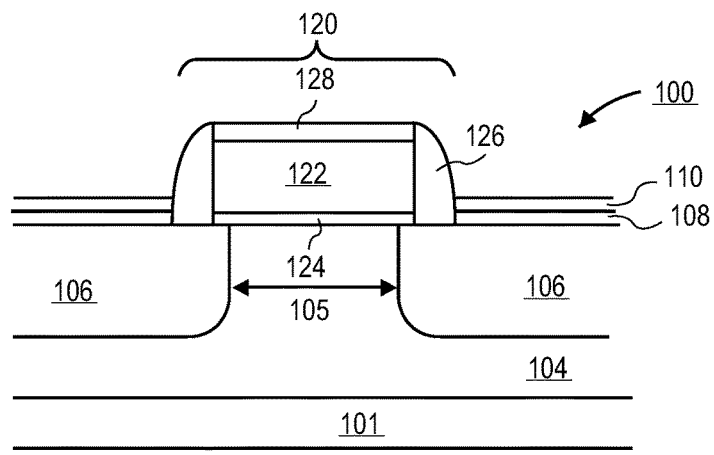
FIGS. 1B-1C illustrates cross-sectional views along line 1-1 of FIG. 1A according to embodiments of the invention.

FIG. 1B is a cross-sectional view of the n-MOS transistor device 100 viewed along the line 1-1 shown in FIG. 1A. According to the embodiment shown in FIG. 1B, the replacement S/D regions 106 extend beneath the gate electrode 122. According to an embodiment, the replacement S/D regions 106 are sufficiently n-type doped in their as-deposited state as a result of group V atom vacancies and carbon that is incorporated unintentionally from metalorganic precursor materials. According to additional embodiments in which the as-deposited S/D regions 106 are not n-type doped, or not sufficiently n-type doped, the replacement S/D regions 106 may be suitably doped with n-type III-V semiconductor dopants, such as Si, Ge, C, or Te. According to an embodiment, the replacement S/D regions 106 have electron concentrations above 1E17 per $cm^3$, or preferably above 1E18 per $cm^3$. Since the replacement S/D regions extend under the gate electrode 122, there is no further need to provide n-type dopants in the replacement active region located below the gate electrode according to this embodiment. As such, the channel region 105 shown in FIG. 1B comprises the width of the replacement active region 104 that is bounded on each side by the replacement S/D regions 106.

Figure 1C:
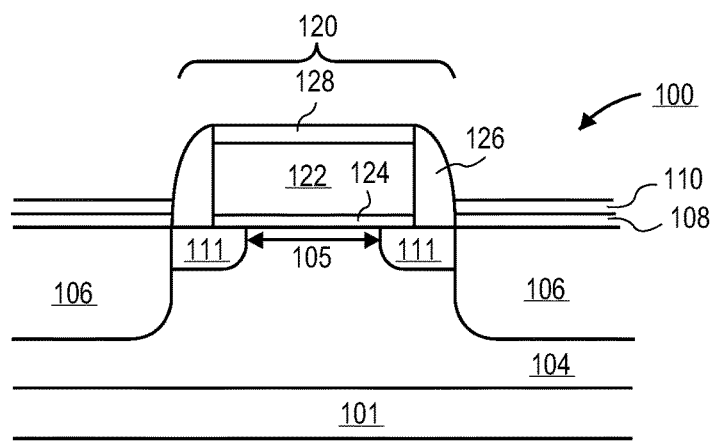

According to an additional embodiment shown in FIG. 1C, the replacement S/D regions 106 do not extend underneath the gate electrode 122. Therefore, portions of the replacement active region 104 below the gate electrode 122 may need to be doped with n-type dopants in order to produce the tip regions 111 underneath the gate structure 120. The tip-regions 111 extend the source and drain below the gate electrode 122. As such, the sources and drains of the transistor device 100 may comprise both the replacement S/D regions 106 and n-type doped portions of the replacement active region 104. Furthermore, since the tip-regions extend the sources and drains into the replacement active region 104 underneath the gate electrode 122, the channel region 105 is bound by the tip-regions 111 instead of by the replacement S/D regions 106. According to an additional embodiment of the invention, the replacement S/D regions 106 extend underneath the spacers 106, but do not extend underneath the gate electrode 122. As such, portions of the replacement active region 104 below the gate electrode 122 still need to be doped with n-type dopants in order to produce the tip regions 111 that extend underneath the gate electrode 122.

FIGS. 1B and 1C also show that a transistor device 100 may include a low contact resistance semiconductor layer 108, such as InAs. Low contact resistance semiconductor layer 108 is strongly conducting and may be formed on the top surface of the replacement S/D regions 106 in order to improve the quality of the electrical connection between the electrical contacts and the replacement S/D regions 106. The low contact resistance semiconductor layer 108 may be polycrystalline or be a single crystal with have a heavily faulted microstructure. According to an embodiment of the invention, the low contact resistance semiconductor layer 108 has a thickness that is between approximately 10 Å and 100 Å. Additionally, a contact resistance reducing metal 110, such as Ni, Ti, Au, Au—Ge, or others, may be formed on the top surface of the replacement S/D regions 106 or on the top surface of the low contact resistance semiconductor layer 108. Formation of contact resistance reducing metal 110 ensures that an electrical connection to the replacement S/D regions 106 is an ohmic contact. While both a low contact resistance semiconductor layer 108 and a contact resistance reducing metal are shown in FIGS. 1B and 1C, it should be recognized that one, both, or neither of the layers are needed according to various embodiments of the invention described herein.

Figure 2A:
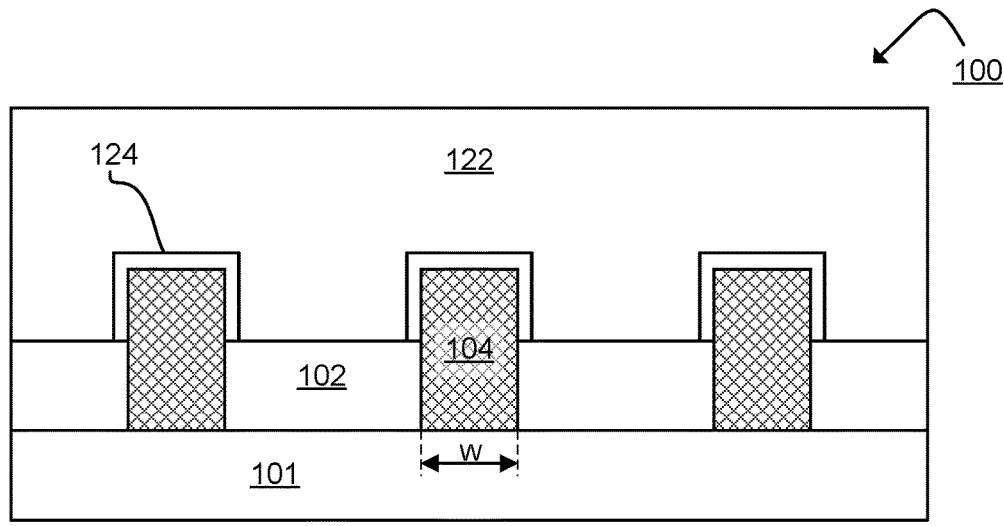
FIGS. 2A-2B illustrates cross-sectional views along line 2-2 of FIG. 1A according to embodiments of the invention.

Embodiments of the present invention describe a transistor device 100 that includes tri-gate transistor devices. FIG. 2A is a cross-sectional view of the transistor device 100 shown in FIG. 1A along line 2-2 according to an embodiment of the invention. FIG. 2A shows that the portions of the replacement active regions 104 below the gate electrode 122 are not recessed below the STI layer 102. As shown, the gate structure 120 conforms to the replacement active regions 104. A gate dielectric material 124 separates the gate electrode 122 from the replacement active region 104. Although the gate electrode 122 is shown as spanning across multiple replacement active regions 104, embodiments of the invention also include a gate electrode 122 that is formed over a single replacement active region 104.

Figure 2B:
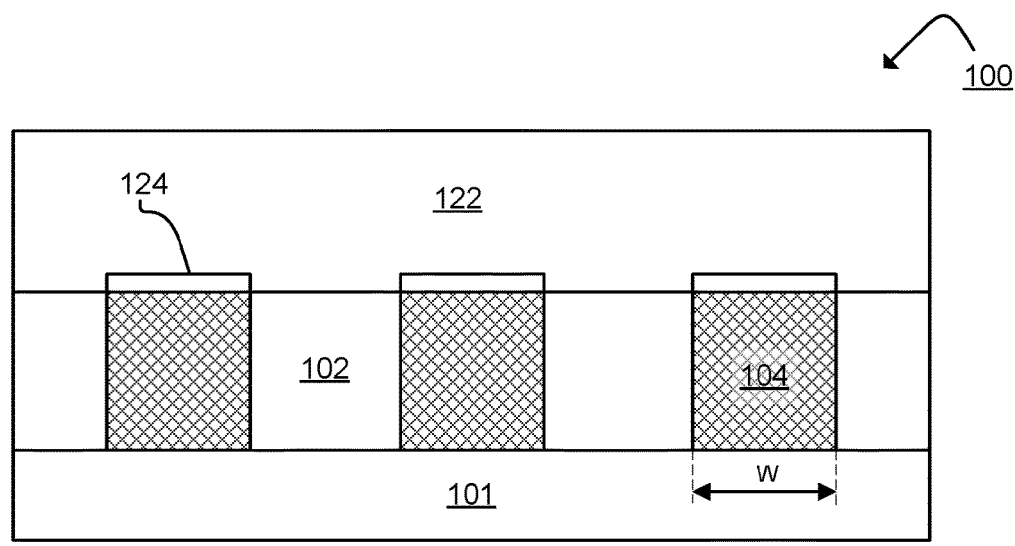

In alternative embodiments, the transistor device 100 may include planar n-MOSFETs, as shown in FIG. 2B. FIG. 2B is a cross-sectional view along line 2-2 of FIG. 1A according to an alternative embodiment of the present invention. In order to form planar n-MOSFET devices in accordance with embodiments of the invention, the top surface of the replacement active regions 104 are maintained substantially coplanar with the top surface of the STI layer 102. Additionally, the width W of the replacement active regions 104 may be increased. Aside from these alterations, the structure of a planar n-MOSFET device in accordance with embodiments of the invention is substantially similar to the remaining disclosure, and as such, will not be repeated here.

Figure 3A:
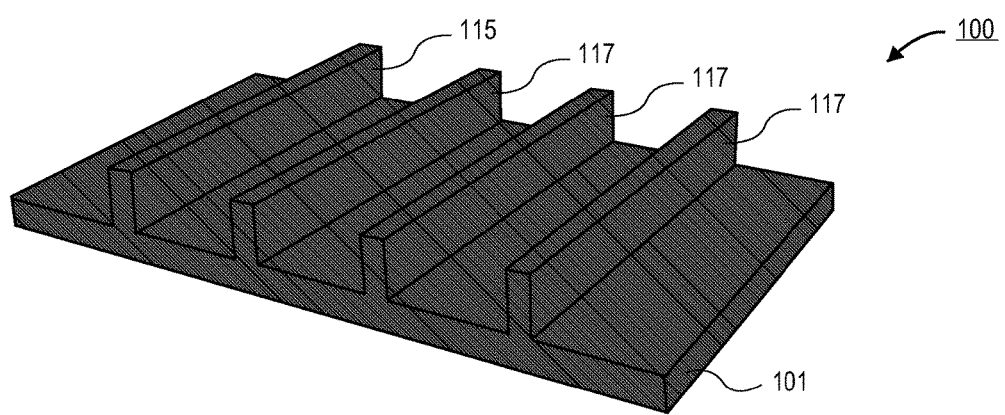
FIGS. 3A-3J illustrates process flow diagrams in accordance with an embodiment of the invention.

Certain embodiments of the present invention may be manufactured according to the processes described with respect to FIGS. 3A-3J. Referring now to FIG. 3A, the semiconductor substrate 101 on which the n-MOS transistor device 100 will be formed is shown. As seen in FIG. 3A, the semiconductor substrate 101 is formed with sacrificial fins 117 and fin 115 extending up from a surface of the substrate.

Though a single fin 115 is shown in FIG. 3A, it is noted that multiple fins 115 may be formed according to additional embodiments of the invention. The sacrificial fins 117 and fin 115 may be substantially rectangular, but other embodiments are not so limited. Sacrificial fins 117 and fins 115 are substantially similar to each other, with the exception that the sacrificial fins 117 serve as a placeholder for the replacement active region 104 to be formed during subsequent processing. Accordingly, the sacrificial fins 117 should be shaped to match the desired shape of the replacement active region 104. According to embodiments of the invention, the sacrificial fins 117 and fin 115 may be high aspect ratio fins, such as fins with a height to width ratio of 10:1 or greater. According to embodiments of the invention, the fins 115 and the sacrificial fins 117 may have a height between approximately 20 nm and 130 nm and have widths between approximately 5 nm and 30 nm. Embodiments may also include a pitch that is approximately 40 nm or greater. As discussed above, the semiconductor substrate 101 may be a monocrystalline silicon substrate, an SOL or the like. Sacrificial fins 117 and fin 115 may be formed with any well-known technique such as masking and etching. Embodiments of the invention include forming the sacrificial fins 117 and fin 115 with a wet or dry etching process that is well-known in the art. While fin 115 is shown as being the outermost fin on the substrate 101, it should be noted that fins 115 may be nested within a set of sacrificial fins 117.

Figure 3B:
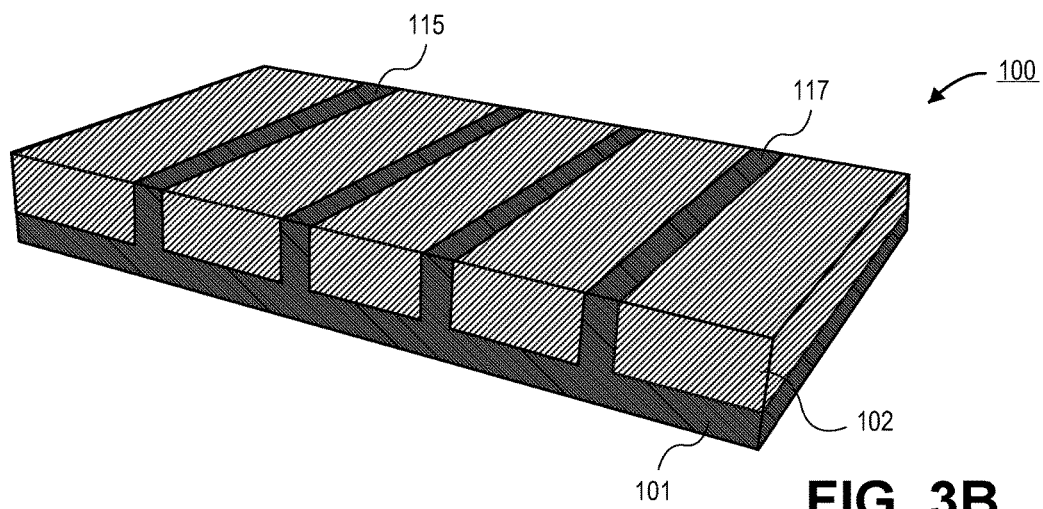

Referring now to FIG. 3B, the trenches between sacrificial fins 117 have been filled with a STI layer 102, such as silicon dioxide. The STI layer 102 may be planarized with the top surface of the sacrificial fins 117 with a chemical-mechanical polishing process. Alternative embodiments may utilize a LOCal Oxidation of Silicon (LOCOS) techniques, or the like, to form the sacrificial fins 117 and layer 102. The STI layer 102 provides an isolating layer that may be used to separate p-type regions from n-type regions, as well as providing isolation between individual transistors.

Figure 3C:
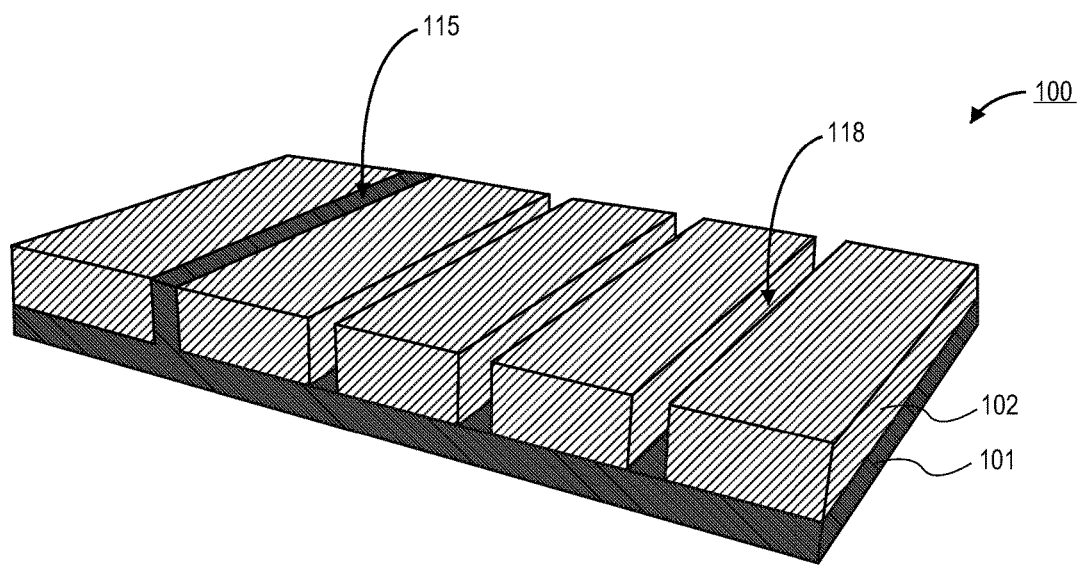

Referring now to FIG. 3C, the three of the sacrificial fins 117 have been etched away to form substantially rectangular replacement active region trenches 118. The etching process may utilize wet or dry etching techniques. As described above, embodiments of the invention are not limited to rectangular shaped channel trenches 118, and the shape of channel trenches 118 may be altered by changing the shape of sacrificial fins 117. The remaining fin 115 may be processed to form different transistor devices that do not require a replacement active region 104, such as silicon p-MOS devices. Additional embodiments may utilize the remaining fin 115 as a non-planar p-MOS device, such as a fin-FET device or a tri-gate device. Accordingly, portions of the substrate 101 may have p-MOS transistors formed thereon, but these transistors may require separate patterning and processing. In this way, both p-type and n-type devices may be formed on the same substrate with each type of device having different active regions. As described from this point forward, only the regions where the sacrificial fins 117 were formed will be shown.

Figure 3D:
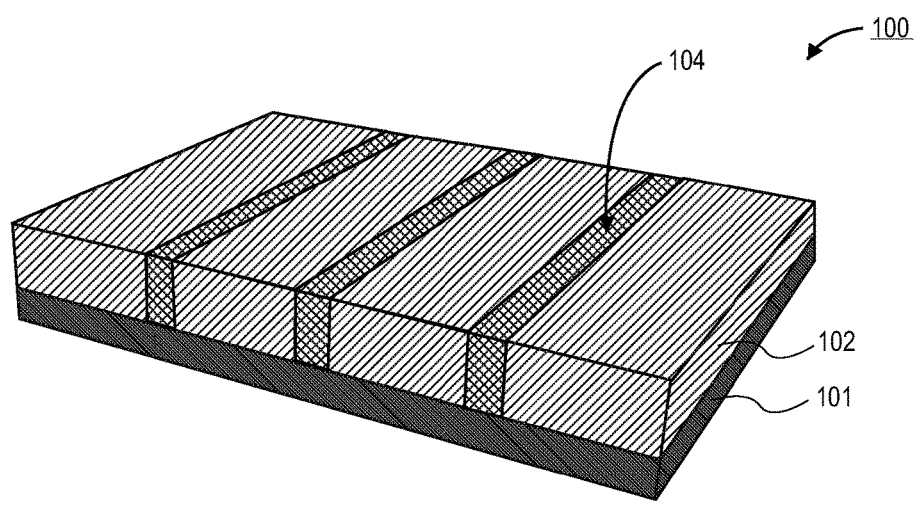

Referring now to FIG. 3D, replacement active regions 104 are formed in the replacement active region trenches 118. According to an embodiment of the invention, the replacement active regions 104 are epitaxially grown. The growth of the replacement active regions 104 is confined by the sidewalls of the STI layer 102 while still in the channel trenches 118, but once the replacement active regions 104 have grown above the height of the STI layer 102, the growth of the replacement active regions 104 may begin extending in the lateral direction. After the formation of the replacement active regions 104, portions that have extended above the STI layer 102 may be planarized with the top surface of the STI layer 102 with a planarization process such as chemical-mechanical polishing. In an embodiment, replacement active regions 104 are formed with a III-V semiconductor material. The replacement active regions 104 may be formed in the channel trenches 118 through the use of nominally selective processes including chemical vapor deposition (CVD), ultra-high vacuum CVD (UHV-CVD), rapid thermal CVD (RT-CVD) or gas-source molecular beam epitaxy (GS-MBE). Selective epitaxy refers to the deposition property of film nucleation and deposition on crystalline surfaces, such as the substrate 101, and results in substantially no deposition on amorphous insulator surfaces, such as the STI layer 102. Selective epitaxy allows for the replacement active regions 104 to be grown bottom-up from the substrate 101 exposed at the bottom of the channel trenches 118. Epitaxial growth in this manner allows for the deposited replacement active regions 104 to be self-aligned to the crystalline regions of the substrate 101 and minimizes the amount of over-growth on adjacent insulator regions, such as the STI layer 102.

Though shown as a single layer in FIG. 3D, it is understood that the replacement active region 104 may be comprised of a single composition layer, or a graded bilayer, or a multi-layer stack of distinct III-V material compositions. Examples of a suitable III-V material for a single layer embodiment may include an InGaAs composition or an InSb composition. Suitable III-V materials for low defect, multi-layer stacks may include layer combinations such as, (GaAs, InP, InGaAs), (InP, InGaAs), (InAlAs, InGaAs), (InP, InGaSb, InSb), or (AlSb, InGaSb, InSb). According to an embodiment of the invention, the replacement active regions 104 are a different semiconductor material than the semiconductor substrate 101.

Figure 3E:
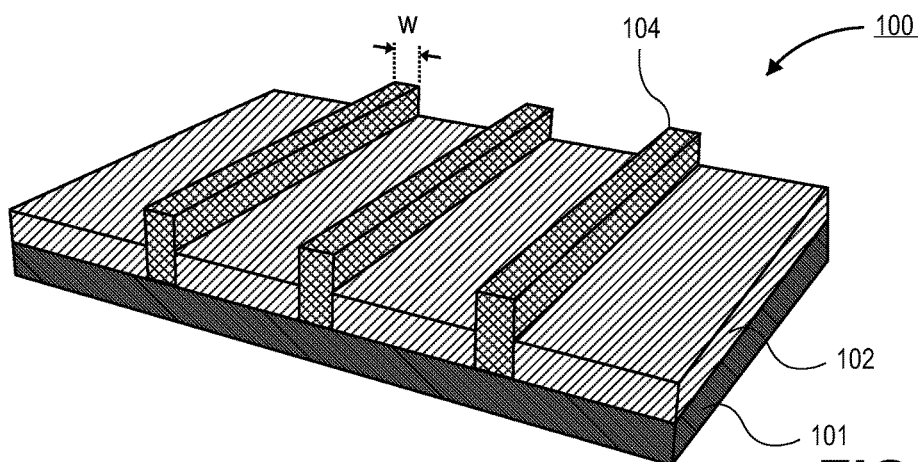

Referring now to FIG. 3E, the STI layer 102 is etched back to allow the replacement active regions 104 to extend above the top surface of the STI layer 102. This process allows for the formation of a fin-FET device. According to an additional embodiment, a planar device may be made instead. When a planar device is desired, the STI layer 102 is not recessed in order to expose top portions of the replacement active regions 104. Additionally, the width of the replacement active region W may be increased in embodiments of the invention that include planar devices. Aside from the lack of the recessing the STI layer 102 and the change in the width W of the replacement active regions 104, the processing of a planar device is substantially similar to the formation of a fin-FET device described herein and therefore will not be repeated here.

According to an embodiment of the invention that utilizes a multi-layer stack, the thickness of the top layer, such as an InGaAs layer, is chosen to be equal to or greater than the thickness of the desired channel region 105. According to an embodiment, the thickness of the top layer of the replacement active region 106 should be equal to or greater than the amount the STI layer 102 is recessed, as shown in FIG. 3E. By way of example, when the recess of the STI layer 102 is 40 nm, a multi-layer stack may include a top layer of InGaAs that has a thickness of approximately 60 nm. According to an embodiment, one or more layers of the replacement active region 106 formed below the top layer may have a combined thickness that is less than the thickness of the STI layer 102 after it has been recessed. By way of example, the one or more underlayers may have a combined thickness between approximately 10 nm and 50 nm.

Figure 3F:
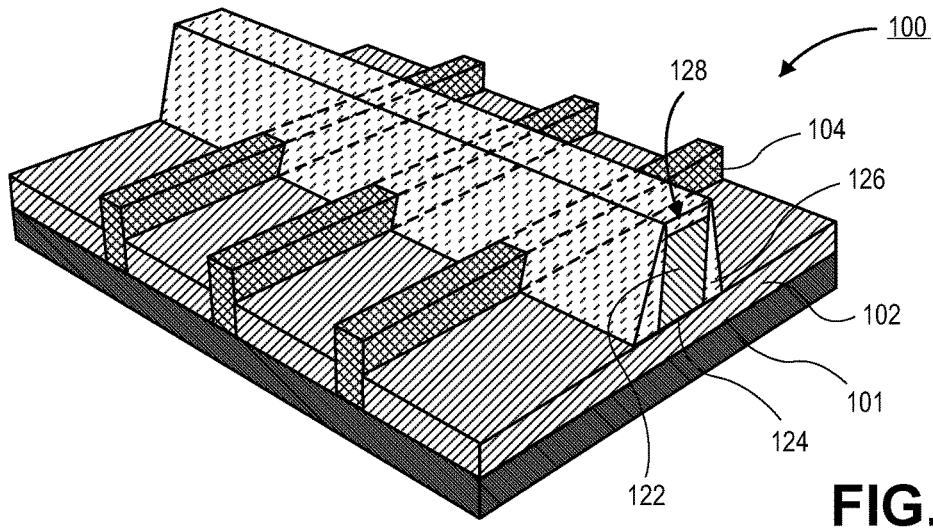

Referring now to FIG. 3F, the gate structure 120 is formed according to techniques well known in the art. The gate structure 120 is formed above the top surface of the STI layer 102 and above portions of the replacement active regions 104. As shown by the dashed lines, the gate structure 120 conforms to the replacements active regions 104. According to an embodiment, a dielectric material and an electrode material may be disposed over the STI layer 102 and the replacement active regions 104. The layers may then be patterned and etched in order to form the gate dielectric 124 and the gate electrode 122. The gate dielectric 124 may be an oxide material, such as silicon dioxide or silicon oxynitride, or any high-k dielectric material, such as, $HfO_2$ or ZrO. The gate electrode 122 may be a suitably doped polysilicon electrode. According to alternative embodiments, the gate electrode 122 may be a metal gate. In embodiments utilizing a metal gate electrode, the gate electrode 122 may be formed with a replacement metal gate (RMG) process. When an RMG process is utilized, the gate dielectric 124 and the gate electrode 122 formed in FIG. 3F may be dummy materials. Subsequent to high temperature processing, the dummy gate dielectric and dummy gate electrode may be removed and a gate dielectric 124 and a metal gate electrode 122 may be formed in its place. The gate structure 120 may also include dielectric gate spacers 126 along the sidewalls. The gate spacers 126 may be formed with a blanket deposition of the spacer material, such as silicon dioxide, silicon nitride, or a silicon carbide, and followed by a spacer etching process. A gate cap 128 may also be disposed over the top surface of the gate electrode 122.

According to embodiments of the invention, prior to forming spacers 126, n-type dopants may be implanted into the replacement active region 104 proximate to gate electrode 122 in order to form the tip regions 111 shown in FIG. 1C. This implant is commonly referred to as a tip or S/D extension implant. Performing the tip implant at this time is beneficial when the replacement S/D recesses do not undercut the gate electrode 122 as shown in FIG. 1C. According to an alternative embodiment, the tip regions 111 may be formed after the spacers 126 have been formed. In such embodiments, the tip regions 111 may be formed by out diffusing n-type dopants into the replacement active region 104 underneath the gate electrode 122 from the replacement S/D regions 106 formed during subsequent processing.

Figure 3G:
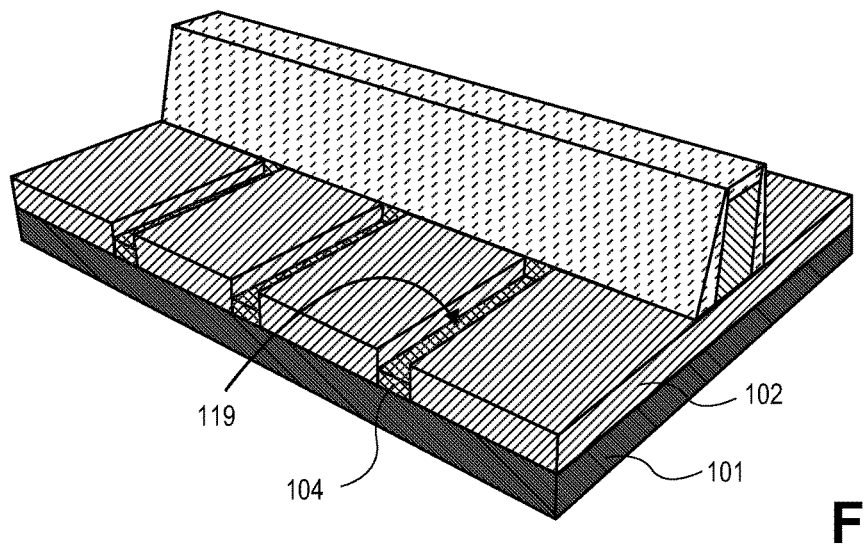

Referring now to FIG. 3G, the replacement active region 104 has been etched to form replacement S/D recesses 119. The etching process may by a dry or wet etching process. Embodiments of the present disclosure control the etching process in order to leave a portion of the replacement active region 104 at the bottom of the S/D recesses 119. According to an embodiment of the invention that utilizes a multi-layer replacement active region 104, the etching process may remove all, or substantially all, of the exposed top layer of the replacement active region 104. Additional embodiments may include etching away portions of the one or more underlayers as well. As the depth of the S/D recesses 119 decreases, the amount of strain that can be transferred to the channel 105 also decreases. However, when the S/D recesses are formed deeper into the replacement active region 104, the quality of the interface between the substrate 101 and the replacement materials will diminish. Accordingly, those skilled in the art recognize that different depths of the S/D recesses 119 may be chosen in order to optimize a given device 100 for a desired purpose. According to an embodiment, the etching process that forms the S/D recesses 119 may also extend below the gate electrode 122 to form an undercut, as shown in FIG. 1B.

Figure 3H:
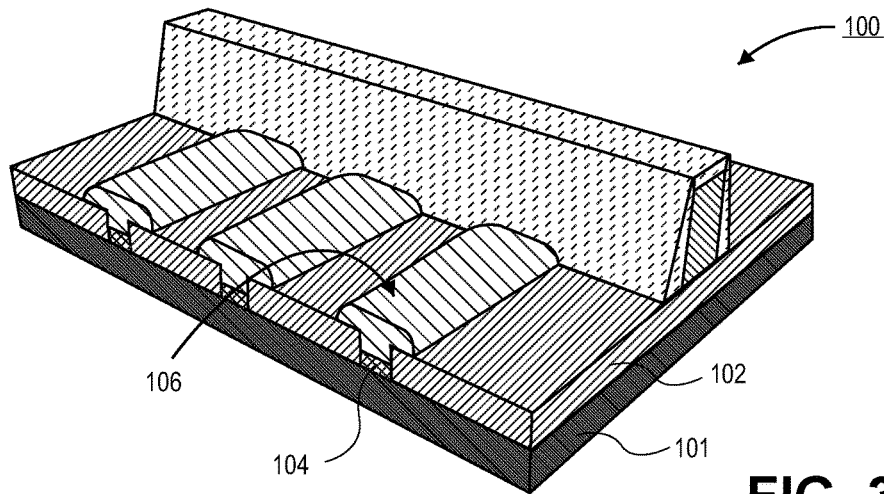
Figure 3H:
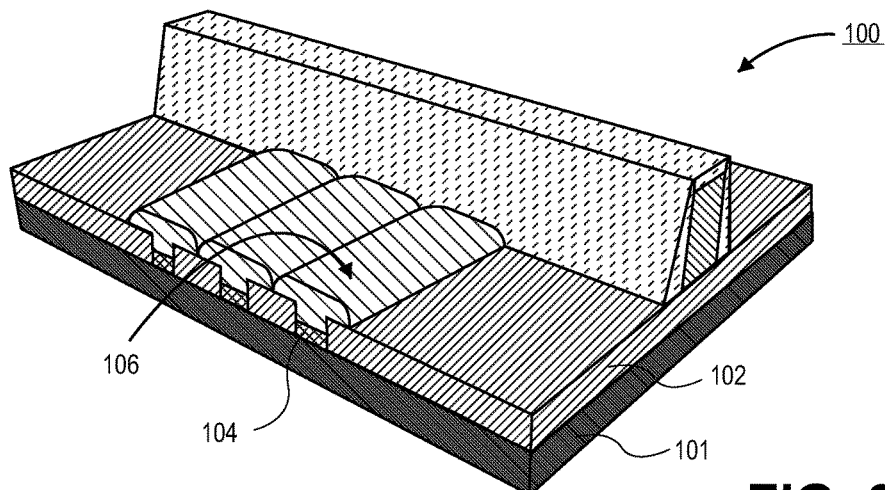

Referring now to FIG. 3H, the replacement S/D regions 106 have been formed over the top surface of the remaining portions of the replacement active region 104. According to an embodiment, the replacement S/D regions 106 are monocrystalline epitaxial layers that are formed in the S/D recesses 119 through the use of nominally selective processes such as CVD, UHV-CVD, RT-CVD or GS-MBE. The epitaxial growth of the replacement S/D regions is initially confined by the STI layer 102, and therefore grows upward while in the S/D recesses 119. In embodiments, the replacement S/D regions 106 may be deposited to a thickness that allows them extend above the top surface of the STI layer 102, as shown in FIG. 3H. As such, the replacement S/D regions 106 may extend up the sidewall of the spacers 126. Additionally, FIG. 3H illustrates that the replacement S/D regions 106 begin to grow in the lateral direction once they extend above the STI layer 102 since they are no longer confined.

Additional embodiments of the invention include replacement S/D regions 106 that have grown together, as shown in FIG. 3H'. While all three replacement S/D regions have grown together in FIG. 3H', additional embodiments may include only two replacement S/D regions 106 connecting with each other, or there may be more than three replacement S/D regions 106 connecting with each other. It may be desirable to have replacement S/D regions 106 grow together in order to form a single transistor device across multiple replacement active regions 104. Accordingly, the distance between each replacement active region 104 may be reduced when the replacement S/D regions 106 are allowed to grow together. This allows for decreasing the pitch between replacement active regions 104, thereby increasing the density of transistors on a substrate, as shown in FIG. 3H'.

In an embodiment, the replacement S/D regions 106 are an epitaxially grown monocrystalline III-V semiconductor material. The III-V semiconductor material chosen for the replacement S/D regions 106 has a smaller lattice constant than the lattice constant of the replacement active region 104. In an embodiment, the III-V semiconductor material chosen for the replacement S/D regions 106 has a smaller lattice constant than the lattice constant of the replacement active region 104. An additional embodiment includes a III-V semiconductor material for the replacement S/D regions 106 that has a smaller lattice constant relative to the replacement active region 104, and also has the same or similar lattice type as the replacement active region 104. According to an additional embodiment, the III-V semiconductor material chosen for the replacement S/D regions 106 has a smaller lattice constant relative to the replacement active regions 104, and has a different elemental composition than the replacement active region 104.

According to an embodiment, the smaller lattice constant is obtained by increasing the atomic percentage of a smaller element. For example, in an embodiment the replacement active region 104 may be formed with a first $In_xGa_{1-x}As$ semiconductor material. The replacement S/D regions 106 may then be formed with a second $In_xGa_{x-1}As$ semiconductor material that has a lower atomic percentage of the larger element, In, and a higher atomic percentage of a smaller element, such as Ga. By way of example, the replacement active regions 104 may be formed with an $In_{0.53}Ga_{0.47}As$ semiconductor material and the replacement S/D regions 106 may be formed with an $In_{0.25}Ga_{0.75}As$ semiconductor material. The resulting mismatch between the lattice constants of the two regions in such an embodiment is 2%. The substitution of Ga for In results in the replacement S/D regions 106 having a lattice with the same crystal structure as the lattice of the replacement active regions 104, but which also have a smaller in-plane lattice constant than the replacement active regions 104. The smaller spaced lattice of the replacement S/D regions 106 generates a uniaxial tensile strain in the channel region 105. Additional embodiments may generate uniaxial tensile strain by utilizing replacement S/D regions 106 that have a smaller lattice constant than the replacement active regions 104 due to the use different III-V elements. By way of example, and not by way of limitation, the replacement active regions 104 may be InAs, and the replacement S/D regions 106 may be GaP.

The amount of uniaxial tensile strain in the channel 105 increases as the lattice constant mismatch between the replacement S/D regions 106 and the replacement active region 104 is increased. However, once the mismatch becomes too large, defects form in the replacement S/D regions 106 and the strain is reduced in the channel 105. The decreased strain in the channel 105 results in decreased electron mobility. As such, the lattice mismatch between the replacement S/D regions 106 and the replacement active region 104 should be sufficient to produce enough strain in the channel 105 to enhance mobility. However, the mismatch should not be extreme enough to form excessive defects in the replacement S/D regions 106 that will prevent strain from forming in the replacement active regions 104. Accordingly, embodiments of the invention may utilize a lattice constant mismatch that is between approximately 0.5% and approximately 6%. An additional embodiment may utilize a lattice constant mismatch that is approximately 2%. The ability to control the lattice mismatch between the replacement active region 104 and the replacement S/D regions 106 improves an otherwise equivalent device by employing a targeted strain field to tune the mobility of the electrical carriers in a favorable way.

In embodiments where the replacement S/D regions 106 are not sufficiently doped with n-type dopants in their as-deposited states, the replacement S/D regions 106 may be in situ doped with n-type dopants, such as Si, Ge, C, or Te, in order to have the desired electron concentrations. According to embodiments, the electron concentration of the replacement S/D regions 106 may be greater than 1E17 per $cm^3$ or preferably greater than 1E18 per $cm^3$. In embodiments where the S/D recesses 119 form undercuts below the gate electrode 122, as shown in FIG. 1B, and where the replacement S/D regions are not sufficiently n-type in the as-deposited state, the replacement S/D regions 106 may be in situ doped with n-type dopants in order to extend the sources and drains below the gate electrode 122. Alternatively, the replacement S/D regions may be doped with an ion implantation process after they have been grown. A dopant drive-in may then be used to diffuse the implanted dopants throughout the S/D regions. According to additional embodiments where there is no undercut formed by the S/D recesses 119, as shown in FIG. 1C, or in embodiments where the undercut extends under the spacers 116 but not under the gate electrode 122, the replacement S/D regions 106 may be doped in situ during their formation. Thereafter, an out-diffusion process may be used to diffuse n-type dopants from the replacement S/D regions 106 into the replacement active region 104 below the gate electrode in order to extend the sources and drains below the gate electrode 122.

Though not shown in FIGS. 3H and 3H', a low contact resistance semiconductor layer 108 and/or a contact resistance reducing metal 110 substantially similar to those shown in FIGS. 1B and 1C may optionally be formed above the replacement S/D regions 106.

Figure 3I:
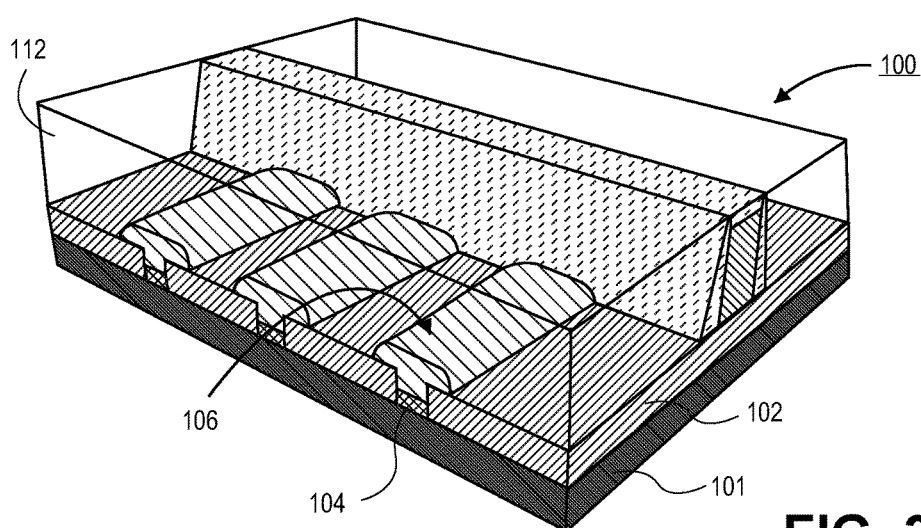
Figure 3J:
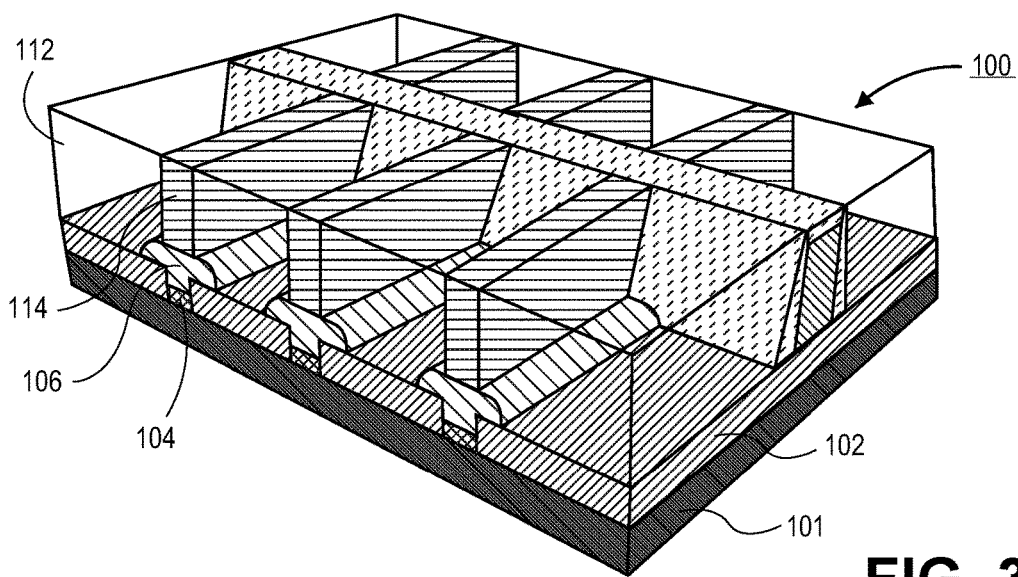

Thereafter, n-MOS transistor device 100 may be finished according to standard processing techniques, as shown in FIGS. 3I-3J. In an embodiment, an inter-layer dielectric (ILD) 112, such as silicon dioxide, may be disposed over the exposed top surface of the STI layer 102 and the replacement S/D regions 106. ILD 112 is depicted as being transparent in order to clearly show features of the transistor device 100. The ILD 112 may be planarized with the top surface of the gate structure 120 with a chemical-mechanical polishing process.

According to embodiments that utilizes a metal gate and follow an RMG process, the dummy gate dielectric and dummy gate electrode may be removed after the ILD 112 has been formed and planarized with the top surface of the gate cap 128 in order to expose the replacement active region. A gate dielectric material and a metal electrode material may then be blanket deposited over the exposed replacement active region 104. The layers may then be polished back to form the gate dielectric 124 and the gate electrode 122. The gate dielectric 124 may be an oxide material, such as silicon dioxide or silicon oxynitride, or any high-k dielectric material, such as, $HfO_2$ or $ZrO$. Since the metal gate electrode 122 is formed after the epitaxial growth processes, it will not be subjected to high temperature processing.

Next, as shown in FIG. 3J, contact vias may be formed through the ILD 112 and filled with a conductive material 114, such as tungsten or any other suitable electrical contact forming material, to provide an electrical contact to the replacement S/D regions 106. While the contact vias and conductive material 114 are shown as being aligned directly above the replacement active regions 104, those skilled in the art will recognize that the alignment need not be perfect and the contacts may be unlanded contacts that extend onto the STI layer 102. Furthermore, while the conductive material 114 is shown as being the same width as the replacement active regions 104, those skilled in the art will recognize that the widths of the contact vias may be larger than the width of the replacement active regions 104 in order to improve the probability of making a successful contact if the alignment of the contact vias is not perfect.

Figure 4A:
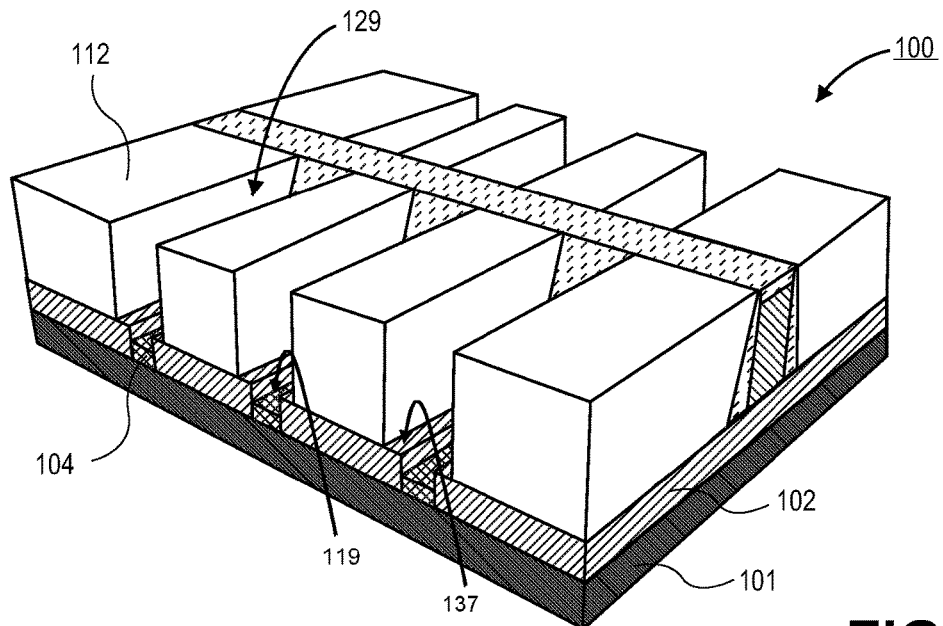
FIGS. 4A-4B illustrates perspective views of n-MOS transistors formed on a semiconductor substrate in accordance with an embodiment of the invention.
Figure 4B:
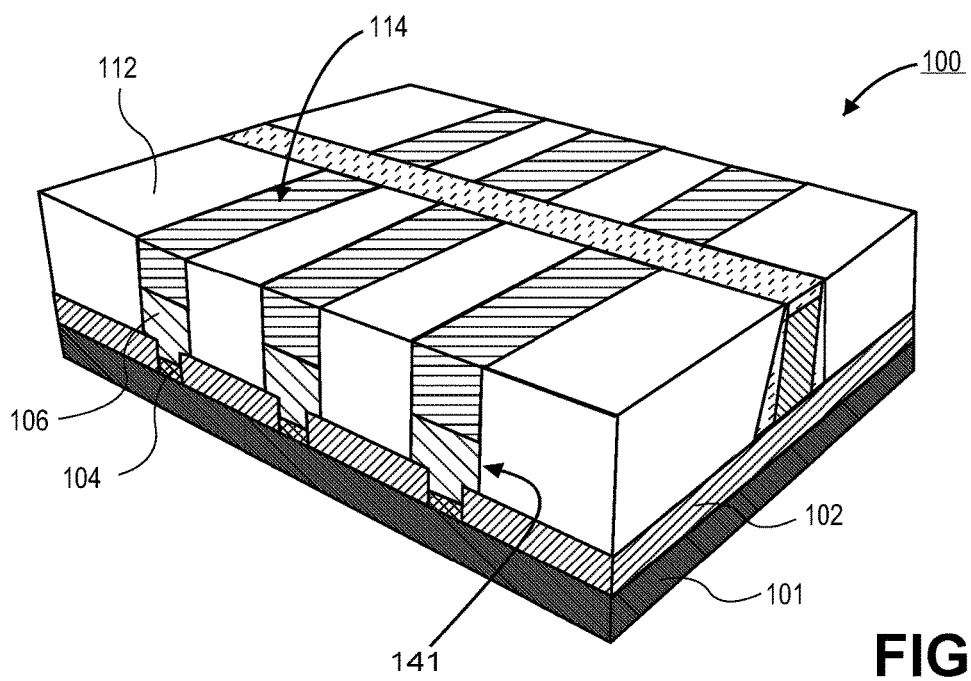

According to additional embodiments, n-MOS transistor device 100 may also be formed with a contact-last process, as shown in FIGS. 4A-4B. In a contact-last process, the initial processing for the formation of an n-MOS transistor device 100 are substantially similar to the processing described with respect to FIGS. 3A-3F, and therefore, the description will not be repeated here. After the processing shown in FIG. 3F, the ILD 112 is disposed above the top surface of the STI layer 102, the exposed portions of the replacement active region 104, and the gate structure 120 prior to recessing the replacement active regions 104. The top surface of the ILD 112 may be planarized with the top surface of the gate structure 120 with a chemical mechanical polishing process. After the ILD 112 has been formed, ILD trenches 129 may be formed through the ILD 112 above the replacement active regions 104. S/D recesses 119 are then formed in the top portion of the replacement active region 104 next to the gate structure 120 as shown in FIG. 4A. The S/D recesses 119 may be formed with either a wet or dry etching process. According to embodiments of the invention, the width of the ILD trenches 129 are greater than the width of the replacement active regions 104 in order to provide room for error in cases where the ILD trench 129 is misaligned. Embodiments of the invention utilize etching chemistries that form the ILD trenches 129 and the S/D recesses 119 in one or more etching processes. A single etching process may comprise the use of an etching chemistry that is selective to the ILD 112 and to the replacement active regions 104 over the STI layer 102. Alternative embodiments may utilize a first etching chemistries to form the ILD trenches 129 and a second etching chemistry to form the S/D recesses 119. Embodiments of the invention include ILD trenches 129 that have exposed top surfaces 137 of the STI layer 102 on either side of the S/D recess 119.

Waiting until after the ILD 112 has been formed before making the S/D recesses 119 provides added protection from short circuits between the individual transistors. As noted above, once the epitaxially grown replacement S/D regions 106 grow above the STI layer, they begin to grow laterally as well. The additional height of the ILD trenches 129 formed through the ILD 112 confines the lateral growth of the replacement S/D regions 106 and prevents them from growing together once the deposited material has formed above the top surface of the STI layer 102. Accordingly, the sidewalls 141 of the replacement S/D regions 106 that grow above the STI layer 102 are substantially vertical, as may be seen in FIG. 4B. Embodiments of the invention include polishing the metal contacts formed in the ILD trenches 129 to be coplanar with the top surface of the ILD 112. Furthermore, the sidewalls of the replacement S/D regions 106 are aligned with the sidewalls of the contact metal 114 due to the confinement provided by the ILD 112. The use of a contact-last process described with respect to FIGS. 4A-4B provides the added benefit of allowing for high density transistors since the growth of the replacement S/D regions 106 is confined by the ILD 112 and therefore, are prevented from shorting together.

Figure 5A:
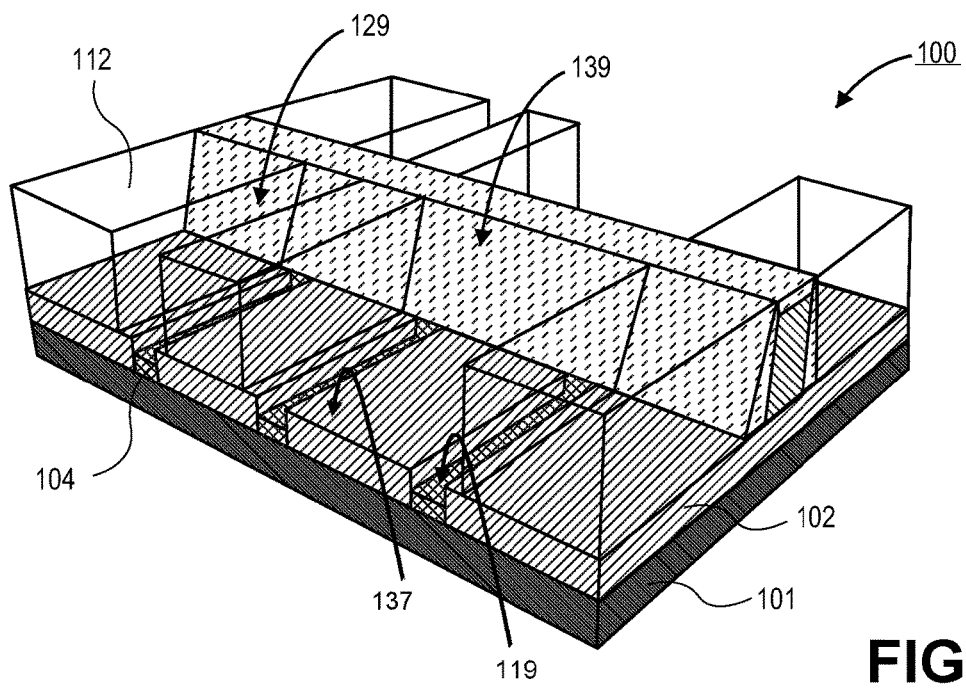
FIGS. 5A-5B illustrates perspective views of n-MOS transistors formed on a semiconductor substrate in accordance with an embodiment of the invention.
Figure 5B:
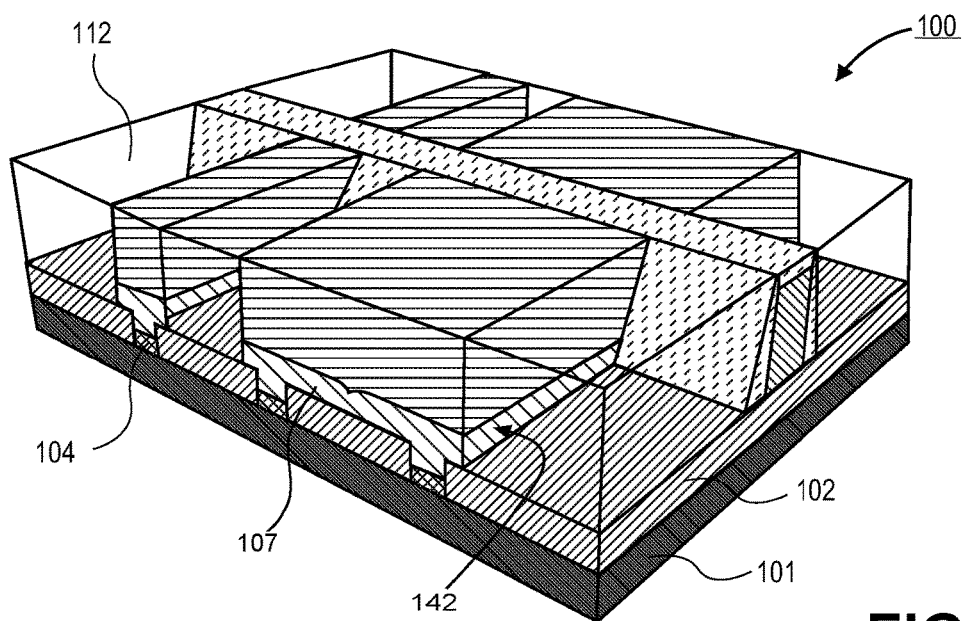

According to an additional embodiment, the replacement S/D regions 106 may be purposely shorted together as shown in the n-MOS transistor device 200 depicted in FIGS. 5A-5B. In FIG. 5A, a block ILD trench 139 is formed across two or more replacement S/D regions by etching through the ILD 112 that has been formed above the STI 102 and the non-recessed replacement active region 104. The top portions of the replacement active regions 104 may also be etched back to form S/D recesses 119. Embodiments of the invention utilize etching chemistries that form the block ILD trench 139 and the S/D recesses 119 in one or more etching processes. A single etching process may comprise the use of an etching chemistry that is selective to the ILD 112 and to the replacement active regions 104 over the STI layer 102. Alternative embodiments may utilize a first etching chemistries to form the block ILD trench 139 and a second etching chemistry to form the S/D recesses 119. While the block ILD trench 139 is depicted as being formed across two of the replacement active regions 104, it should be understood that a block ILD trench 139 may be formed across as many replacement active regions 104 as desired. The ILD trench 129 and the replacement S/D recess 119 formed on the far left of FIG. 5A may be formed in a manner substantially similar to that described with respect to FIGS. 4A and 4B, and as such will not be repeated here.

After the formation of the block ILD trench 139 and the replacement S/D recesses 119, a block replacement S/D region 107 may be formed, as shown in FIG. 5B. According to an embodiment, the block replacement S/D region 107 is epitaxially grown over the two or more exposed replacement active regions 104 at the bottom of the S/D recesses 119 in the block ILD trench 139. As described above with respect to FIGS. 3H and 3H', once the epitaxially grown material extends above the top surface of the STI layer 102 its growth is no longer confined to the vertical direction. Accordingly, the epitaxially grown replacement S/D regions begin to growing laterally towards each other across the top surface 137 of the exposed STI layer 102 separating the replacement active regions 104. The unconfined replacement S/D regions eventually grow together and create a short-circuit between the two replacement active regions and form a replacement S/D block 107. The growth of the replacement S/D block 107 laterally in the direction away from the point where the connection between the replacement S/D regions is made is confined by sidewalls of the block ILD trench 139. Accordingly, the sidewalls 142 of the block replacement S/D region 107 that grow above the STI layer 102 are substantially vertical, as may be seen in FIG. 5B. Furthermore, the sidewalls of the block replacement S/D regions 107 are aligned with the sidewalls of the contact metal 114 due to the confinement provided by the ILD 112. Since the sidewalls of the block ILD trench 139 confine the lateral growth of the block replacement S/D regions 107, the short-circuiting of multiple replacement S/D regions 106 can be more accurately controlled compared to the unconfined growth depicted in FIGS. 3H and 3H'. As an example, replacement S/D region 106 formed in the ILD trench 129 is isolated from the replacement S/D block 107, and it remains independently controllable. Aside from the connection of two or more replacement S/D regions 106, the replacement S/D block 107 is substantially similar to the replacement S/D regions 106 described above, and therefore will not be repeated here.

The block ILD trench 139 in FIGS. 5A and 5B is formed across two replacement active regions 104, however other embodiments are not limited. According to additional embodiments, a block ILD trench 139 may span across three or more replacement active regions 104. Additionally, the sources of two or more transistors may be coupled together whereas their respective drains remain independent of each other.

While n-MOS devices have been described in detail above, those skilled in the art will recognize that p-MOS devices may be formed in a similar manner. According to an embodiment of the invention a p-MOS devices may be fabricated using a similar process but with the use of materials with opposite conductivity types. By way of example, the replacement active regions 104 may be doped with n-type dopants and the replacement S/D regions may be doped with p-type dopants. In embodiments that utilize tip regions 111, the tip regions may be formed with p-type dopants as well. Furthermore, in a p-type device the carriers are holes, and as such a compressive strain is needed to increase the mobility of the holes. As such, embodiments of the invention including p-type devices require that the lattice constant of the replacement S/D regions 106 be larger than the lattice constant of the replacement active regions. According to embodiments of the invention, the increase in the lattice constant of the replacement S/D regions 106 may be obtained by increasing the atomic percent of a larger element in the composition, or by using a material with different atomic elements.

Figure 6:
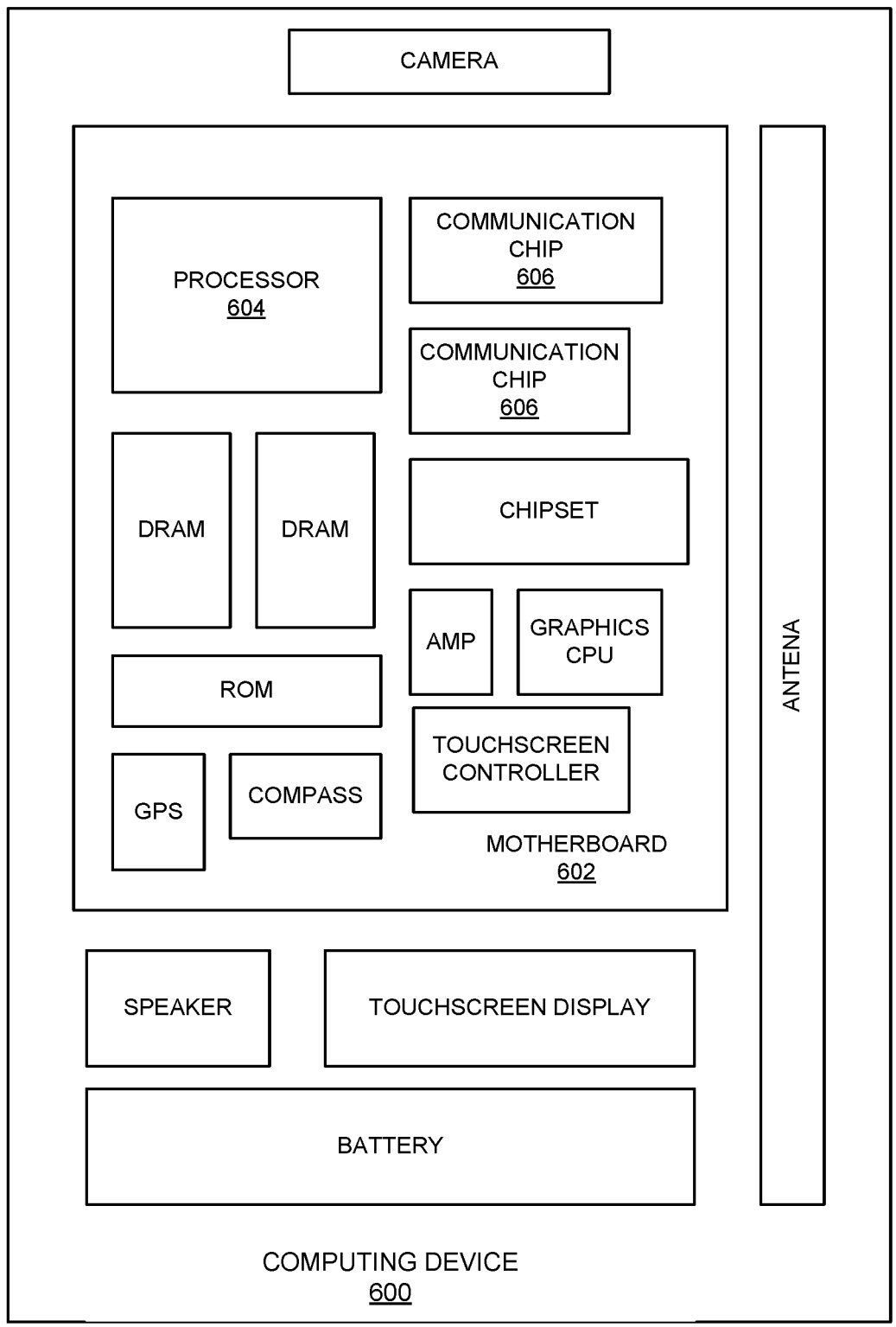
FIG. 6 illustrates a schematic diagram of a computing device that utilizes an n-MOS transistor device in accordance with an embodiment of the invention.

FIG. 6 illustrates a computing device 600 in accordance with one implementation of the invention. The computing device 600 houses a board 602. The board 602 may include a number of components, including but not limited to a processor 604 and at least one communication chip 606. The processor 604 is physically and electrically coupled to the board 602. In some implementations the at least one communication chip 606 is also physically and electrically coupled to the board 602. In further implementations, the communication chip 606 is part of the processor 604.

Depending on its applications, computing device 600 may include other components that may or may not be physically and electrically coupled to the board 602. These other components include, but are not limited to, volatile memory (e.g., DRAM), non-volatile memory (e.g., ROM), flash memory, a graphics processor, a digital signal processor, a crypto processor, a chipset, an antenna, a display, a touchscreen display, a touchscreen controller, a battery, an audio codec, a video codec, a power amplifier, a global positioning system (GPS) device, a compass, an accelerometer, a gyroscope, a speaker, a camera, and a mass storage device (such as hard disk drive, compact disk (CD), digital versatile disk (DVD), and so forth).

The communication chip 606 enables wireless communications for the transfer of data to and from the computing device 600. The term "wireless" and its derivatives may be used to describe circuits, devices, systems, methods, techniques, communications channels, etc., that may communicate data through the use of modulated electromagnetic radiation through a non-solid medium. The term does not imply that the associated devices do not contain any wires, although in some embodiments they might not. The communication chip 606 may implement any of a number of wireless standards or protocols, including but not limited to Wi-Fi (IEEE 802.11 family), WiMAX (IEEE 802.16 family), IEEE 802.20, long term evolution (LTE), Ev-DO, HSPA+, HSDPA+, HSUPA+, EDGE, GSM, GPRS, CDMA, TDMA, DECT, Bluetooth, derivatives thereof, as well as any other wireless protocols that are designated as 3G, 4G, 5G, and beyond. The computing device 600 may include a plurality of communication chips 606. For instance, a first communication chip 606 may be dedicated to shorter range wireless communications such as Wi-Fi and Bluetooth and a second communication chip 606 may be dedicated to longer range wireless communications such as GPS, EDGE, GPRS, CDMA, WiMAX, LTE, Ev-DO, and others.

The processor 604 of the computing device 600 includes an integrated circuit die packaged within the processor 604. In some implementations of the invention, the integrated circuit die of the processor includes one or more devices, such as MOS transistors with III-V replacement channel regions and III-V replacement S/D regions built in accordance with implementations of the invention. The term "processor" may refer to any device or portion of a device that processes electronic data from registers and/or memory to transform that electronic data into other electronic data that may be stored in registers and/or memory.

The communication chip 606 also includes an integrated circuit die packaged within the communication chip 606. In accordance with another implementation of the invention, the integrated circuit die of the communication chip includes one or more devices, such as MOS-FET transistors built in accordance with implementations of the invention.

In further implementations, another component housed within the computing device 600 may contain an integrated circuit die that includes one or more devices, such as MOS-FET transistors built in accordance with implementations of the invention.

In various implementations, the computing device 600 may be a laptop, a netbook, a notebook, an ultrabook, a smartphone, a tablet, a personal digital assistant (PDA), an ultra mobile PC, a mobile phone, a desktop computer, a server, a printer, a scanner, a monitor, a set-top box, an entertainment control unit, a digital camera, a portable music player, or a digital video recorder. In further implementations, the computing device 600 may be any other electronic device that processes data.

Additional embodiments of the invention include a semiconductor device comprising, a semiconductor substrate, one or more replacement active regions disposed over a top surface of the semiconductor substrate, wherein the replacement active regions are a first III-V semiconductor material, a gate structure formed above one or more replacement active regions, source/drain (S/D) recesses in the replacement active regions, and replacement S/D regions formed in the S/D recesses, wherein the replacement S/D regions comprise a second III-V semiconductor material having a lattice constant smaller than a lattice constant of the first III-V semiconductor material. Additional embodiments of the invention further comprise a semiconductor device wherein the replacement S/D regions further comprise a low contact resistance semiconductor layer, wherein the low contact resistance semiconductor layer is a single crystal or polycrystalline material. Additional embodiments of the invention further comprise a semiconductor device wherein the mismatch between the lattice constants of the first and second III-V semiconductor materials is between 0.5% and 6%. Additional embodiments of the device further comprise a semiconductor device, wherein the replacement active region further comprises one or more additional III-V semiconductor layers, wherein the first III-V semiconductor material and the one or more additional III-V semiconductor layers include one of the following layer arrangements: (GaAs, InP, InGaAs), (InP, InGaAs), (AlSb, InGaAs), (InAlAs, InGaAs), (InP, InGaSb, InSb), or (AlSb, InGaSb, InSb). Additional embodiments of the invention further comprise a semiconductor device further comprising a shallow trench isolation (STI) layer formed between adjacent replacement active regions. Additional embodiments of the invention further comprise a semiconductor device wherein portions of the replacement S/D regions extend above a top surface of the STI layer. Additional embodiments of the invention further comprise a semiconductor device wherein two or more replacement S/D regions have portions extending above the STI layer that contact each other to form a block replacement S/D region. Additional embodiments of the invention further comprise a semiconductor device wherein the sidewalls of block replacement S/D region are confined by an inter-layer dielectric (ILD) disposed above the STI layer. Additional embodiments of the invention further comprise a semiconductor device wherein the sidewalls of the portions of the block replacement S/D regions extending above the STI layer are substantially vertical. Additional embodiments of the invention further comprise a semiconductor device wherein the portions of the replacement S/D regions extending above the STI layer are confined by an ILD disposed above the STI layer. Additional embodiments of the invention further comprise a semiconductor device wherein the sidewalls of the portions of the replacement S/D regions extending above the STI layer are substantially vertical. Additional embodiments of the invention further comprise a semiconductor device wherein the S/D recesses extend under the gate structure.

Additional embodiments of the invention include a method for forming a semiconductor device comprising, providing a semiconductor substrate having one or more sacrificial fins, disposing a shallow trench isolation (STI) layer between the sacrificial fins, etching away the one or more sacrificial fins to form one or more trenches between the STI layer, disposing a first III-V semiconductor material in the one or more trenches to form one or more replacement active regions, forming a gate structure over a surface of the STI layer and over portions of the replacement active regions, forming S/D recesses into portions of the replacement active regions adjacent to the gate structure, and disposing a second III-V semiconductor material in the S/D recesses to form replacement S/D regions, wherein the second III-V semiconductor material has a lattice constant that is smaller than the first III-V semiconductor material. Additional embodiments of the invention further comprise a method wherein a mismatch between the lattice constants of the first and second III-V semiconductor materials is between 0.5% and 6%. Additional embodiments of the invention further comprise a method wherein disposing the first III-V semiconductor material in the one or more trenches further comprises disposing a first III-V semiconductor stack in the one or more trenches, wherein the first III-V semiconductor stack comprises a layer arrangement of either (GaAs, InP, InGaAs), (InP, InGaAs), (AlSb, InGaAs), (InAlAs, InGaAs), (InP, InGaSb, InSb), or (AlSb, InGaSb, InSb). Additional embodiments of the invention further comprise a method wherein portions of the replacement S/D regions extend above the STI layer. Additional embodiments of the invention further comprise a method wherein portions of two or more of the replacement S/D regions that extend above the STI layer are in contact with each other. Additional embodiments of the invention further comprise a method further comprising, disposing an inter-layer dielectric (ILD) over the STI layer, the replacement active region, and the gate structure, and forming an ILD trench through the ILD above one or more replacement active regions prior to forming the S/D recesses. Additional embodiments of the invention further comprise a method wherein the sidewalls of the replacement S/D regions are confined by the ILD trench and are substantially vertical. Additional embodiments of the invention further comprise a method wherein the S/D recesses extend below the gate structure. Additional embodiments of the invention further comprise a method further comprising, recessing the STI layer to expose an upper portion of the replacement active regions prior to forming the gate structure over the surface of the STI layer and over portions of the replacement active regions. Additional embodiments of the invention further comprise a method wherein the replacement S/D regions further comprise a low contact resistance semiconductor layer, wherein the low contact resistance semiconductor layer is a single crystal or polycrystalline material.

Additional embodiments of the invention include a method for forming a semiconductor device comprising, disposing a STI layer above a substrate forming one or more trenches into the STI layer, disposing a first semiconductor material in the one or more trenches to form one or more replacement active regions, forming a gate structure above a surface of the STI layer and over portions of the replacement active regions, disposing an inter-layer dielectric (ILD) over the STI layer, the replacement active region, and the gate structure, forming an ILD trench through the ILD above one or more replacement active regions forming S/D recesses into portions of the replacement active regions adjacent to the gate structure, and disposing a second semiconductor material in the S/D recesses to form replacement S/D regions, wherein the sidewalls of the S/D regions are confined by the ILD trench and are substantially vertical. Additional embodiments of the invention further comprise a method wherein a mismatch between the lattice constants of the first and second III-V semiconductor materials is between 0.5% and 6%. Additional embodiments of the invention further comprise a method wherein disposing a first semiconductor material in the one or more trenches further comprises disposing a first III-V semiconductor stack in the one or more trenches, wherein the first III-V semiconductor stack comprises a layer arrangement of either (GaAs, InP, InGaAs), (InP, InGaAs), (AlSb, InGaAs), (InAlAs, InGaAs), (InP, InGaSb, InSb), or (AlSb, InGaSb, InSb).

Reference throughout this disclosure to "one embodiment" or "an embodiment" means that a particular feature, structure, or characteristic described in connection with the embodiment is included in at least one embodiment of the present invention. The appearance of the phrases "in one embodiment" or "in an embodiment" in various places throughout this disclosure are not necessarily all referring to the same embodiment. Furthermore, the particular features, structures, or characteristics may be combined in any suitable manner in one or more embodiments.

In the foregoing Detailed Description, various features are grouped together in a single embodiment for the purpose of streamlining the disclosure. This method of disclosure is not to be interpreted as reflecting an intention that the claimed embodiments of the invention require more features than are expressly recited in each claim. Rather, as the following claims reflect, inventive subject matter lies in less than all features of a single disclosed embodiment. Thus the following claims are hereby incorporated into the Detailed Description, with each claim standing on its own as a separate embodiment.

It will be readily understood to those skilled in the art that various other changes in the details, material, and arrangements of the parts and method stages which have been described and illustrated in order to explain the nature of this invention may be made without departing from the principles and scope of the invention as expressed in the subjoined claims.

What is claimed is:

1. A semiconductor device comprising:
   a semiconductor substrate;
   one or more replacement active regions disposed over a top surface of the semiconductor substrate, wherein the replacement active regions are a first III-V semiconductor material;
   a gate structure formed above one or more replacement active regions;
   source/drain (S/D) recesses in the replacement active regions;
   replacement S/D regions formed in the S/D recesses, wherein the replacement S/D regions comprise a second III-V semiconductor material having a lattice constant smaller than a lattice constant of the first III-V semiconductor material; and
   a shallow trench isolation (STI) layer formed between adjacent replacement active regions, wherein at least a portion of the replacement S/D regions contact a top surface of the STI layer.

2. The semiconductor device of claim 1, wherein the replacement S/D regions further comprise a low contact resistance semiconductor layer, wherein the low contact resistance semiconductor layer is a single crystal or polycrystalline material.

3. The semiconductor device of claim 1, wherein the mismatch between the lattice constants of the first and second III-V semiconductor materials is between 0.5% and 6%.

4. The semiconductor device of claim 1, wherein the replacement active region further comprises one or more additional III-V semiconductor layers, wherein the first III-V semiconductor material and the one or more additional III-V semiconductor layers include one of the following layer arrangements: (GaAs, InP, InGaAs), (InP, InGaAs), (AlSb, InGaAs), (InAlAs, InGaAs), (InP, InGaSb, InSb), or (AlSb, InGaSb, InSb).

5. The semiconductor device of claim 1 wherein portions of the replacement S/D regions extend above a top surface of the STI layer.

6. The semiconductor device of claim 5, wherein two or more replacement S/D regions have portions extending above the STI layer that contact each other to form a block replacement S/D region.

7. The semiconductor device of claim 6, wherein the sidewalls of block replacement S/D region are confined by an inter-layer dielectric (ILD) disposed above the STI layer.

8. The semiconductor device of claim 7, wherein the sidewalls of the portions of the block replacement S/D regions extending above the STI layer are substantially vertical.

9. The semiconductor device of claim 5, wherein the portions of the replacement S/D regions extending above the STI layer are confined by an ILD disposed above the STI layer.

10. The semiconductor device of claim 9, wherein the sidewalls of the portions of the replacement S/D regions extending above the STI layer are substantially vertical.

11. The semiconductor device of claim 1, wherein the S/D recesses extend under the gate structure.

* * * * *